United States Patent [19]

Goronkin

[11] Patent Number: 5,061,970
[45] Date of Patent: Oct. 29, 1991

[54] ENERGY BAND LEVELING MODULATION DOPED QUANTUM WELL

[75] Inventor: Herbert Goronkin, Tempe, Ariz.

[73] Assignee: Motorola, Inc., Schaumburg, Ill.

[21] Appl. No.: 533,214

[22] Filed: Jun. 4, 1990

[51] Int. Cl.$^5$ .............. H01L 27/12; H01L 45/00; H01L 29/161; H01L 33/00

[52] U.S. Cl. ............................ 357/04; 357/16; 357/17

[58] Field of Search ..................... 357/4, 16, 17

[56] References Cited

U.S. PATENT DOCUMENTS

| | | | |
|---|---|---|---|
| 4,261,771 | 4/1981 | Dingle et al. | 357/4 |
| 4,348,686 | 9/1982 | Esaki et al. | 357/4 |
| 4,760,579 | 7/1988 | Schulman et al. | 357/17 |
| 4,857,971 | 8/1989 | Burnham | 357/4 |

OTHER PUBLICATIONS

"The Tunneling of Electron–Hole Pairs in a Raman Scattering Study of a Thin Layer GaAs/AlAs Superlattice", Grinin et al., Solid State Communications, vol. 67, #3, pp. 317–319, 1988.

"Stimulated Emission in Ultra Thin (20 Å) Al$_x$Ga$_{1-x}$As-GaAs Single Quantum Well Hetero Structures", Lo et al, App. Phys. Lett., vol. 52, #22, 30 May 1988, pp. 1353–1355.

Primary Examiner—Rolf Hille
Assistant Examiner—Mahshid Saadat
Attorney, Agent, or Firm—Joe E. Barbee; Stuart T. Langley

[57] ABSTRACT

A superlattice structure comprising a host quantum well with a plurality of mini quantum wells formed therein is provided. The host quantum well has a confined energy state $E_2$ which lies very near a lower band energy $V_1$ of the host well, while each of the mini quantum wells has a single confined energy level $E_1$ which lies below $V_1$. Charge carriers are provided to the quantum well by doping material in the barrier layers to provide modulation doping of the quantum well. The mini quantum wells contain at least one monolayer of another material within their boundaries. The monolayer material is preferably electrically inactive and is a source of phonons which are generated for the purpose of charge carrier-phonon coupling in order to cause charge carrier pairing. In a preferred embodiment a transfer quantum well is formed between the barrier region of the host quantum well and the outermost mini quantum wells. The transfer quantum well has an energy state which couples to the $E_1$ energy state of the mini quantum wells and serves to transfer charge to the mini quantum wells.

12 Claims, 3 Drawing Sheets

ENERGY BAND LEVELING MODULATION DOPED QUANTUM WELL

BACKGROUND OF THE INVENTION

This invention relates, in general, to quantum well structures, and more particularly, to a modulation doped quantum well which is useful in enhanced conductivity structures made from semiconductor materials.

Modulation doping is often used in quantum well structures to provide charge carriers to the quantum well. A modulation doped quantum well has doping atoms formed in a barrier region outside of the quantum well, yet close enough to the quantum well so that the charge carriers can tunnel through the barrier. These charge carries then fall into the quantum well where they alter the conductivity of the quantum well region. Modulation doping is particularly advantageous because doping atoms are not located in the quantum well itself, resulting in improved charge carrier lifetime and mobility in the quantum well.

One problem with modulation doping, however, is that it modifies the energy band structure both inside the well and in the barrier region which surrounds the well. The modified band structure can result in new energy bands developing near the edges of the well which in turn trap charge carriers near the edges. In some quantum well applications it is advantageous to have a high charge carrier density at the center of the quantum well rather than at the edges. Also, the energy band modification caused by modulation doping can result in reduced charge coupling, and therefore poorer superconducting performance. Examples of such enhanced conductivity structures are described in copending U.S. Pat. applications Ser. Nos. 411,780 and 501,59 by the inventor of the present invention and assigned to the same assignee, and incorporated herein by reference.

Enhanced conductivity results in a crystal lattice when electrons, which are normally in energy levels within plus or minus $k_BT$ of a fermi energy ($E_F$), collapse into an energy state which is approximately $k_BT_C$ below $E_F$, where $T_C$ is the critical temperature at which superconductivity occurs and $k_B$ is the Boltzmann constant. Electrons can only collapse by coupling or pairing into what is known as "Copper pairs". Cooper pairs require each of the paired electrons in an energy level to have equal and opposite momentum and spin which results in a tighter electron packing density than is possible under normal conditions. Paired electrons scatter with equal and opposite change in momentum. Thus paired electrons carry charge in the energy range $k_BT_C$ with zero resistance.

Accordingly, a key feature of enhanced conductivity materials is an ability to allow electrons to exist as paired electrons rather than fermions, which are responsible for normal resistive charge conduction. Much work has been done recently to develop materials in which paired electrons can exist at high temperatures. The present invention deals with a method of promoting the formation of paired electrons at temperatures where such pairing would not naturally occur.

Electrons in a crystal lattice have a characteristic coherence length which is determined by electronic and crystallographic properties of the crystal lattice. External forces such as heat and electromagnetic fields affect this electron coherence length. Electrons in normal conduction states repel each other, and will not come close enough to form pairs. Electrons in enhanced conductivity materials, however, interact with lattice vibrations (phonons) to form pairs. Paired electrons are separated from each other by the electron coherence length. In naturally occurring superconductors, for example, electronphonon interactions result in superconductivity at low temperature, where the electron coherence length is sufficiently long.

The present invention uses semiconductor materials to provide a synthetic lattice which is adapted to promote electron-phonon interaction, and in particular, to promote electron-phonon interactions which result in formation of paired electrons in materials and at temperatures where paired electrons do not normally exist. More specifically, the present invention comprises a method and structure for increasing charge carrier density near the center of a quantum well, where useful electron-phonon interactions are more likely to occur.

Accordingly, an object of the present invention is to provide a new enhanced conductivity structure having a higher number of electron-phonon interactions.

Another object of the present invention is to provide a modulation doped quantum well having increased charge carrier density near the center of the quantum well.

A further object of the present invention is to provide a modulation doped quantum well having an energy band leveling structure.

Yet another object of the present invention is to provide an enhanced conductivity quantum well with improved tolerance to material composition and wider energy bands.

Yet a further object of the present invention is to provide a resonant superlattice superconductor with quantum wells having phonon generators with an optical longitudinal phonon energy equal to spacing between two energy states.

A still further object of the present invention is to provide an enhanced conductivity material having a more uniform spacing between two energy states through the entire width of the quantum well.

SUMMARY OF THE INVENTION

The above and other objects and advantages of the present invention are achieved by a quantum well structure comprising a host quantum well with a plurality of mini quantum wells formed therein. The host quantum well has a confined energy state $E_2$ which lies very near a lower band energy $V_1$ of the host well, while each of the mini quantum wells contributes to the formation of a superlattice energy level $E_1$ which lies below $V_1$. Charge carriers are provided to the quantum well by doping material in the barrier layers to provide modulation doping of the quantum well. The mini quantum wells contain at least one monolayer of another material within their boundaries. The monolayer material is preferably electrically inactive and is a source of phonons which are generated for the purpose of charge carrier-phonon coupling in order to cause charge carrier pairing. In another embodiment a transfer quantum well is formed between the barrier region of the host quantum well and the outermost mini quantum wells. The transfer quantum well has an energy state which couples to the $E_1$ energy state of the mini quantum wells and serves to transfer charge to the mini quantum wells.

DETAILED DESCRIPTION OF THE DRAWINGS

The present invention enhances electron coupling in a superlattice structure by increasing the density of ground state electrons in the center of a quantum well where the occurrence of electron-phonon interactions is greatest. Although described in terms of an enhanced conductivity lattice, it should be understood that the present invention is applicable to any modulation doped quantum well structure where it is desirable to have a high charge carrier density near the center of the quantum well. Also, the present invention is useful where constant spacing between energy levels in a quantum well is desired.

Paired electrons can be formed by electron interactions with a crystal lattice, also known as electron-phonon interactions. In most naturally occurring superconductive materials, characteristic energy levels and phonon spectra are such that electron pairing and thus superconductivity can occur. The present invention involves creating a synthetic material in which energy levels of a quantum well are designed to match with optical phonon energies of a phonon generator which is placed in the quantum well. Further, the present invention involves specific relationships between energy levels and phonon generator energy which result in a resonant condition in a quantum well which maximizes the probability of electron-phonon interaction, and therefore maximizes the formation of paired electrons.

Figure 1:
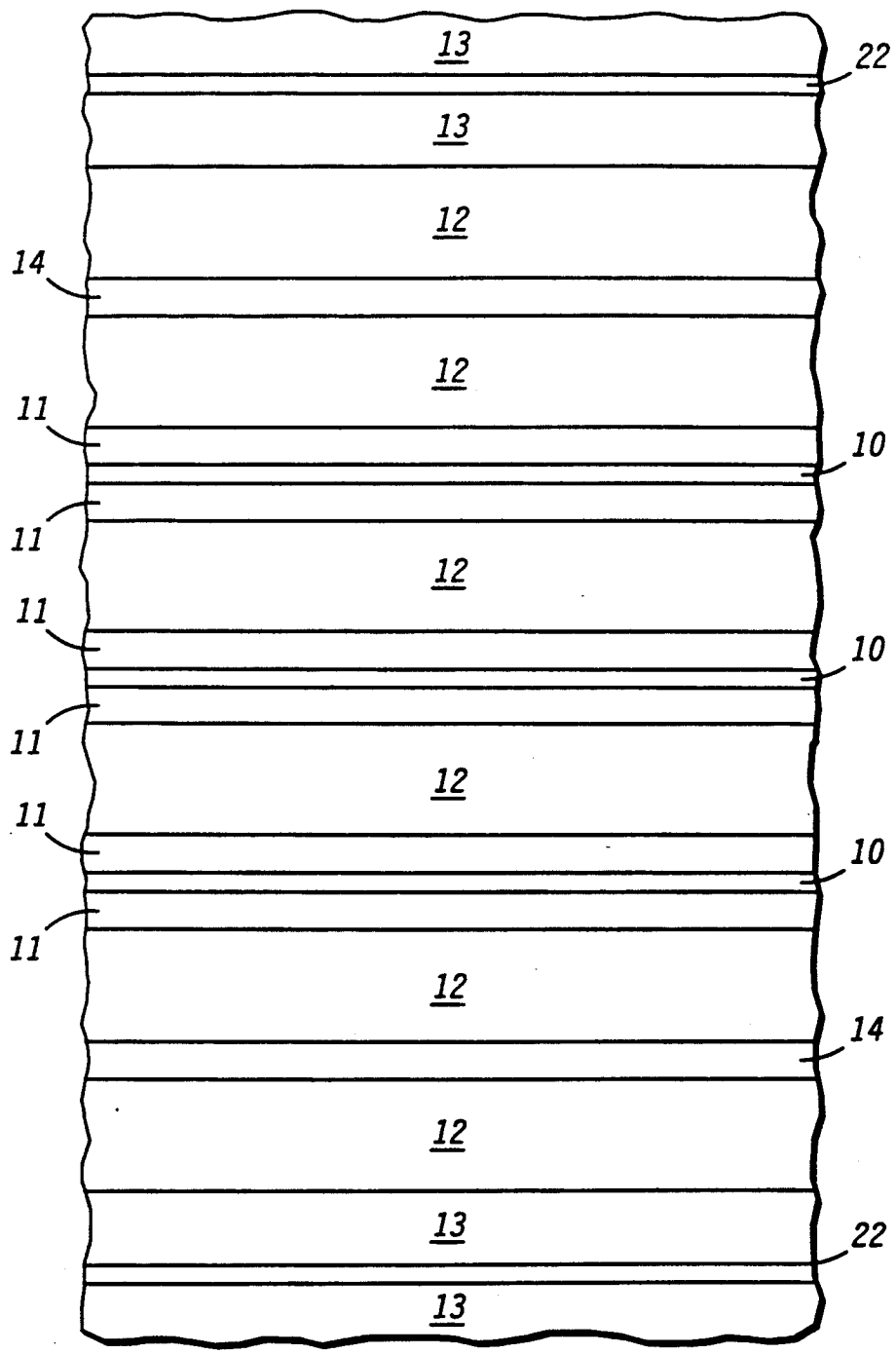
FIG. 1 illustrates an enlarged cross sectional view of a small portion of the present invention.

FIG. 1 illustrates a highly enlarged view of a small portion of the present invention. Barrier layers 13 comprise a wide bandgap material such as aluminum gallium arsenide (AlGaAs), or the like. A host quantum well is formed between barrier layers 13 by narrow bandgap layers 12. AlGaAs is a suitable material for the host quantum well layers 12 as long as barrier layers 13 have a wider band gap than host quantum well layers 12. As an example, barrier layers 13 may comprise $Al_{0.3}Ga_{0.7}As$ and host quantum well layers 12 may comprise $Al_{0.1}Ga_{0.9}As$ to achieve the proper band energy relationship. As should be apparent, a wide variety of materials including silicon, germanium as well as III-V and II-VI compound semiconductors may be used to form barrier layers 13 and host quantum well layers 12. It is important, however, that barrier layers 13 have a wider band gap than host quantum well layers 12. As will become apparent, the particular choice of materials will be determined by desired relationships between quantum energy levels and phonon energy spectra of the materials.

Towards the center of the host quantum well a number of mini quantum wells 11 are formed separated from each other by regions of host quantum well material 12. Host quantum well material 12 can also be thought of as a second barrier layer which contains electrons in mini quantum wells 11. Mini quantum wells 11 comprise a material with a narrower band gap than that of host quantum well 12. Gallium Arsenide (GaAs) is a suitable material. In a preferred embodiment host quantum well layers 12 are about eleven monolayer thick and mini quantum well layers 11 are about nine monolayers thick. Other criteria for material selection will be discussed hereinafter in reference to a conduction band diagram of the structure.

When the modulation doped quantum well is to be used as an enhanced conductivity material, phonon generator regions 10 are formed in each of the mini quantum wells. Preferably, each phonon generator layer 10 comprises a monolayer of a material which has an optical phonon energy less than that of the mini quantum well material. Indium arsenide (InAs) is a good choice for phonon generators 10 when GaAs is used for mini quantum well layers 11 because InAs has an optical phonon energy less than that of GaAs.

Doping layers 22 which are formed in barrier layers 13 provide charge carriers which then fall into the host quantum well. To provide electrons to the quantum well, layers 22 may comprise any suitable material such as silicon, or the like. Doping layers 22 must be placed close enough to the quantum well so that electrons can tunnel through barrier layers 13.

Optionally, transfer quantum wells 14, also called charge sinks, are formed between barrier 13 and the mini quantum wells 11 which are nearest the edge. It is important that transfer wells 14 have a confined energy state $E_1$ that is coupled to a confined energy state $E_1$ in mini quantum wells 11. It is also important that transfer wells 14 have a comparatively low charge capacity so that they can be easily filled with charge carriers provided by doping layers 22. Low charge capacity is provided by making transfer wells 14 physically thinner than mini-quantum wells 11. Because transfer wells 14 are thinner and lie in a narrower bandgap material than mini-quantum wells 11, quantum energy levels in transfer well 14 are designed to have ground state energy levels that coincide with the ground state energy levels in wells 11 which encourages charge transfer from wells 14 to wells 11. If transfer wells 14 have the same energy level structure as miniquantum wells 11, charge will tend to resonate between quantum energy levels within transfer well 14 rather than couple to mini-quantum wells 11 as desired. Transfer wells 14 are designed to conduct charge carriers toward the center of host quantum well 12 via tunnelling in the confined energy level.

In operation, current flows through the superlattice structure shown in FIG. 1 parallel to the plane of the layers. Also, current flows primarily in quantum well layers 11 and 12 as opposed to barrier layers 13. Although the invention has been described in terms of specific material types for each layer, it should be understood that it is the relationship between band gap energy and phonon spectra of each of the layers that is important. It will be apparent to those of skill in the art that numerous combinations of materials can be used to produce quantum wells, barrier layers, and modulation doping. As will be seen, phonon generator layers 10 may also comprise different materials, particularly when different quantum well materials are chosen. Also, although the present invention is described in terms of electron coupling to form Cooper pairs, it should be understood that hole coupling will also result in enhanced conductivity. The principles and elements of the present invention are equally applicable to hole coupling when material and doping changes are made.

Figure 2:
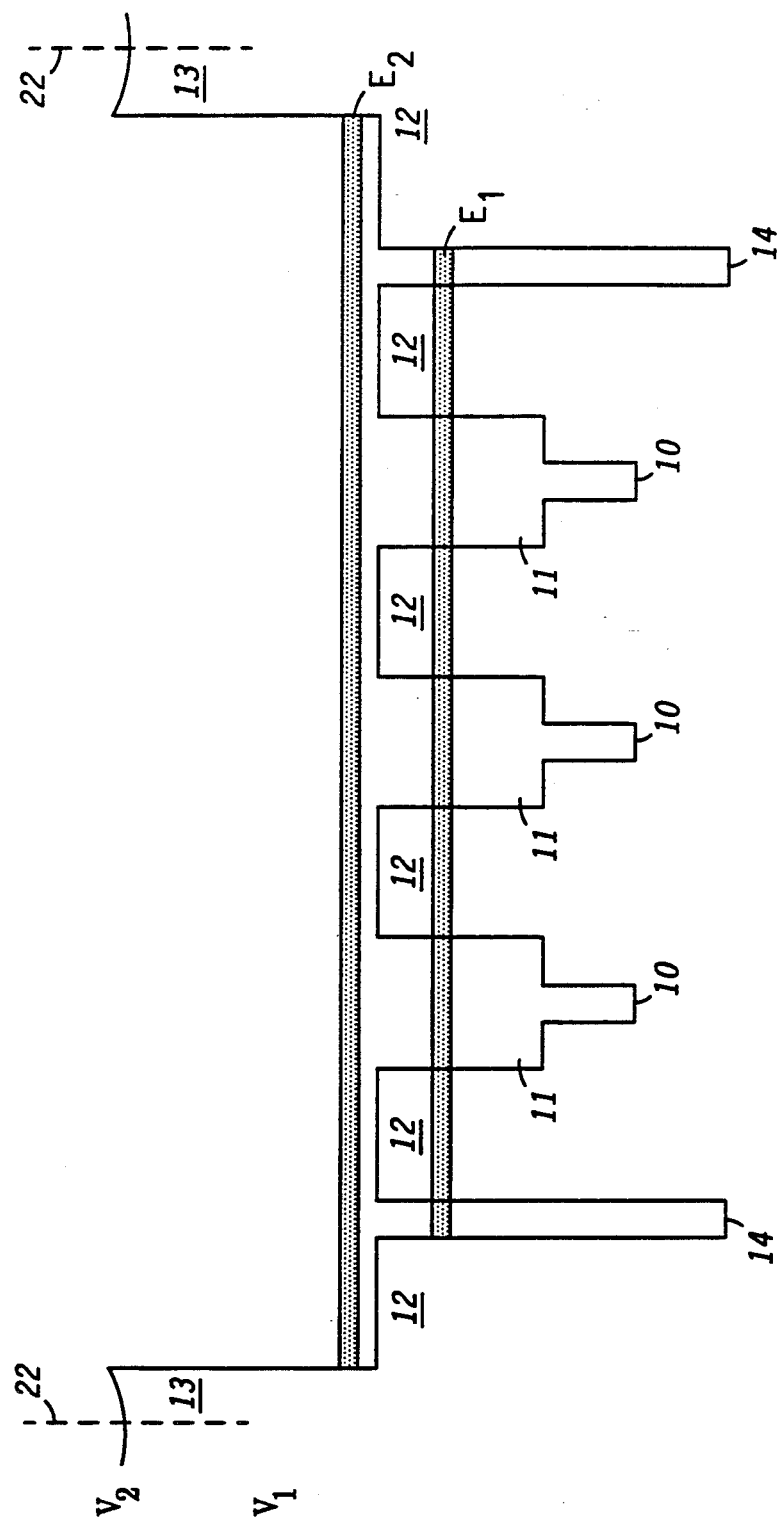
FIG. 2 illustrates a conduction band diagram of quantum well characteristics of one embodiment present invention.

FIG. 2 illustrates a conduction band, $E_c$, diagram of the quantum well shown in FIG. 1. The conduction band diagram shown in FIG. 2 is a highly simplified view of a superlattice structure having phonon generators 10 shown in FIG. 1. Phonon generators 10 correspond to a spike in the conduction band shown in FIG. 2. Each monolayer 10 results in a spike near the center of a quantum well 11. Conduction band energy level $V_2$ corresponds to barrier layers 13. Mini quantum wells 11 comprise layers 11 shown in FIG. 1, and host quantum well 12 corresponds to host quantum well layers 12. Host quantum well 12 has a narrower bandgap than barrier layers 13 and thus a drop in the conduction band energy from $V_2$ to $V_1$ exists near the edges of host quantum well 12.

Figure 3:
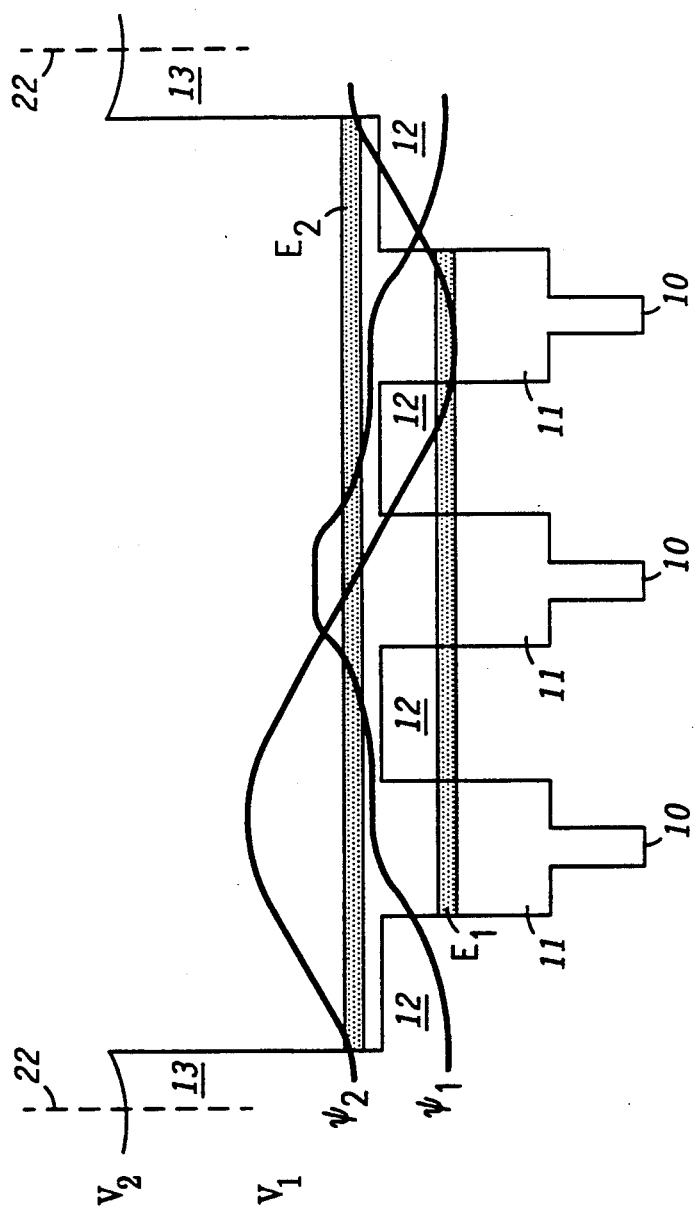
FIG. 3 illustrates a conduction band diagram of another embodiment of the present invention.

Electrons in the superlattice structure have characteristic energy levels $E_1$ and $E_2$ and wave functions $\psi_1$ and $\psi_2$ which are superimposed on $E_1$ and $E_2$ in FIG. 3. $E_1$ is confined in mini quantum wells 11 while $E_2$ lies slightly above mini-quantum wells 11 in host quantum well 12. $E_1$ and $E_2$ are illustrated as energy bands of finite thickness. This results from overlap of wave functions between each of the mini quantum wells and results in a wider range of energies at which electrons may exist. This feature is particularly useful in enhanced conductivity quantum wells where controlled electron coupling between energy level is desired. The wider energy bands result in greater processing tolerance when manufacturing an enhanced conductivity quantum well.

It should be noted that $V_2$ is concave downward as illustrated in FIG. 2 and FIG. 3. This band bending is caused by electrons originating in doping layer 22 which have fallen into the quantum wells. Normally, an opposed band bending occurs at the lower quantum well band energy $V_1$ forcing this band to bend downward near the edge of host quantum well 12. This band bending would result in distortion of energy levels $E_1$ and $E_2$, and could result in new energy levels being formed. Transfer wells 14 and mini quantum wells 11 largely counteract this bending within the boundaries of quantum well 12, resulting in comparatively flat, stable energy levels $E_1$ and $E_2$.

FIG. 3 illustrates another embodiment which differs from the embodiment shown in FIG. 2 in that transfer wells 14 are omitted. Transfer wells 14 will normally be used only for wide quantum wells; the present invention is useful with or without transfer wells 14. As shown in FIG. 3, charge distribution of phonon generator 10 will have a maxima which is in the center of each mini quantum well 11. Phonon generator layers 10 will have no phonon modes transverse to the two dimensional sheet. The electron wave function $\psi_1$ in the ground state $E_1$ also has a maxima in the center of quantum wells 12. An electron in the ground state can couple strongly to the phonon generator phonon and become excited to the next state upon absorption of the phonon.

The state $E_2$, is characterized by an asymmetric wave function $\psi_2$ that passes through zero at the center of quantum well 12. Electrons in this state will couple weakly to the centrally located phonon generator 10 and will tend to not absorb a phonon generator phonon. Instead, electrons in the $E_2$ state are more likely to emit a phonon generator phonon. In this structure, electrons in the first excited state tend to absorb phonons while electrons in the second excited state tend to emit phonons. Electrons in state $E_1$ have symmetric wave functions while electrons in state $E_2$ have asymmetric wave functions. Transitions from $E_1$ to $E_2$ normally are rare since parity is not conserved; however, because of the resonance condition which allows many electrons in state $E_1$ to absorb phonon generator phonons, the probability of transfer to state $E_2$ is substantially increased.

An important feature of an enhanced conductivity quantum well is that phonons produced by the phonon generator have substantially the same energy as the difference between $E_2$ and $E_1$. Because the energy gap between first and second energy states ($E_1$–$E_2$) is substantially equal to the phonon energy of phonon generators 10, and because substantial numbers of electrons in state $E_1$ can absorb an optical phonon from the generator, the electron-phonon interactions caused by the presence of the phonon generator causes electrons to be paired by the absorption-emission process. The coupling between electrons can be expressed by the equation:

$$M \propto \frac{V^2}{(E_2 - E_1)^2 - (\hbar\omega_{LO}^{PG})^2}$$

where V is referred to as the to electron-phonon coupling constant and $\hbar\omega_{LO}^{PG}$ is the energy of a longitudinal optical (LO) phonon generator (PG) phonon.

In the present invention, the spacing between the first two energy levels ($E_1$–$E_2$) is equal to one optical phonon energy ($\hbar\omega_{LO}^{PG}$). From the electron-electron coupling equation it can be seen that this relationship between phonon energy and energy levels $E_1$ and $E_2$ results in a resonance condition which maximizes electron-phonon interaction. It is convenient to build the entire structure from commonly available epitaxial materials such as GaAs, AlGaAs, and InAs. Since GaAs has a longitudinal optical phonon energy of about 37 meV, InAs which has an optical phonon energy of about 30 meV is a good phonon generator choice. The required spacing between the first two energy levels ($E_1$–$E_2$) is about 30 meV when InAs is used as a phonon generator. The actual LO phonon energy of the InAs monolayer will be lower that the bulk value since its two dimensional lattice will be in compression when it is surrounded on both sides by GaAs, which has a smaller lattice constant than InAs. The parameters of a rectangular quantum well that produce this energy level spacing are:

| | |
|---|---|
| Mini Quantum Well material: | GaAs |
| Host quantum well material: | $Al_{0.1}Ga_{0.9}As$ |
| Barrier material: | $Al_{0.3}Ga_{0.7}As$ |
| Barrier layer potential, | $V_2 = 0.244$ eV |
| Host quantum well lower band potential, | $V_1 = 0.081$ eV |

Referring again to FIG. 2 and FIG. 3, an example of a structure resulting in quantum energy level relationships described above using those materials and eight monolayers of GaAs for each of mini-quantum wells 11 will be described. A phonon generator monolayer 10 comprising InAs is formed in the center of each mini-quantum well 11. Each mini quantum well 11 is separated from each other by eleven monolayers of host quantum well material 12. Additionally, barrier layer 13 is separated from the outermost quantum well 11 by eleven monolayers of host quantum well material 12. If transfer wells 14 are used, the layer thicknesses must be adjusted to maintain the correct separation between $E_2$ and $E_1$. The exact width of transfer wells 14 and barrier layers 13 can be adjusted to provide desired doping concentration and charge transfer characteristics. This structure is provided as an example; it should be understood that a wide variety of materials and layer thicknesses can provide similar energy band relationships in a quantum well structure.

By now it should be appreciated that there has been provided an enhanced conductivity material capable of operating at temperatures well above superconductivity temperatures. The invention employs a superlattice structure having a plurality of phonon generators sandwiched between two quantum well layers wherein the phonon generator generates phonon having optical energy substantially equal to the difference between energy levels of the quantum well. The interaction between electrons in the quantum well and phonons generated by the phonon generator causes a resonant condition in which electrons interact with the quantum well lattice absorbing and emitting phonons which in turn couple with the electrons. The coupled electrons can travel through the crystal lattice parallel to the phonon generator layer in enhanced conductivity state.

I claim:

1. A modulation doped quantum well structure comprising: a host quantum well having a central portion and edge portions; charge sinks formed in the edge portions of the host quantum well; and a number of narrow quantum wells formed in the central portion of the host quantum well, wherein the charge sinks and the narrow quantum wells comprise materials with a narrower bandgap than the host quantum well.

2. The quantum well structure of claim 1 further comprising a phonon generator region near the center of each of the narrow quantum wells.

3. The quantum well structure of claim 2 wherein the phonon generator layers comprise a two dimensional sheet of indium arsenide.

4. The quantum well structure of claim 1 wherein the charge sinks have a confined energy level which is resonant with a confined energy level of the narrow quantum wells.

5. The quantum well structure of claim 2 wherein the host quantum well comprises aluminium gallium arsenide, the narrow quantum wells comprise gallium arsenide, and the phonon generator region comprises indium arsenide.

6. A modulation doped quantum well comprising: a pair of first barrier regions of a first material type; a pair of charge transfer quantum wells spaced from each of the first barrier regions; a plurality of mini quantum wells formed between the two charge transfer quantum wells; and a plurality of second barrier regions comprising a material having a narrower bandgap than the first barrier regions, wherein the second barrier regions separate the mini quantum wells from each other, and separate the charge transfer quantum wells from the mini quantum wells and the first barrier regions.

7. The quantum well of claim 6 further comprising phonon generator regions formed in each of the mini quantum wells which serve to couple electrons in an energy level $E_1$ of the mini quantum wells and in an energy state $E_2$ of the second barrier regions.

8. The quantum well of claim 6 wherein the charge transfer quantum wells have a lower charge capacity than the mini quantum wells, and have a confined energy state which is approximately equal to a confined energy state of the mini quantum wells.

9. A method for increasing charge carrier density at the center of a host quantum well comprising: providing barrier regions having excess charge carriers; providing the host quantum well contained within the barrier regions having a confined energy level $E_2$; providing at least one mini quantum well near the center of the host quantum well, wherein the mini quantum well has a confined energy level $E_1$; providing at least one transfer well near the barrier regions, wherein the transfer well is smaller and has a narrower bandgap than the mini quantum well and the transfer well has a confined energy level which is substantially equal to $E_1$; filling the transfer well with the excess charge carriers; and transferring the excess charge carriers from the transfer well to the mini quantum well.

10. The method of claim 9 further comprising forming a phonon generator in the mini quantum well generating phonons having an energy substantially equal to $E_2-E_1$.

11. A complex quantum well structure comprising: a first quantum well having a band potential $V_1$ and a second quantum energy level $E_2$ which is greater than $V_1$; a plurality of second quantum wells formed in the first quantum well, wherein the second quantum wells have a ground state energy level $E_1$ which is less than $V_1$; and a third quantum well formed near an edge of the first quantum well, wherein the third quantum well has a ground state energy level approximately equal to $E_1$.

12. A modulation doped quantum well comprising: a host quantum well; charge sinks placed near edges of the quantum well; and a plurality of mini quantum wells formed in the host quantum well between the charge sinks.

* * * * *